United States Patent
Stevenson et al.

(10) Patent No.: US 10,402,027 B2
(45) Date of Patent: Sep. 3, 2019

(54) TRANSMITTER AXIS PROJECTION CONSTRUCTION FOR CAPACITIVE SENSING

(71) Applicant: Synaptics Incorporated, San Jose, CA (US)

(72) Inventors: Matthew Stevenson, San Jose, CA (US); John Weinerth, San Jose, CA (US); Jonathan Losh, San Jose, CA (US); Derek Solven, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 137 days.

(21) Appl. No.: 15/682,284

(22) Filed: Aug. 21, 2017

(65) Prior Publication Data

US 2019/0056817 A1   Feb. 21, 2019

(51) Int. Cl.
   *G06F 3/044*   (2006.01)
   *G01R 27/26*   (2006.01)
   *G06F 3/041*   (2006.01)

(52) U.S. Cl.
   CPC ......... *G06F 3/044* (2013.01); *G01R 27/2605* (2013.01); *G06F 3/0418* (2013.01)

(58) Field of Classification Search
   CPC .................... G06F 3/044; G01R 27/2605
   See application file for complete search history.

(56) References Cited

U.S. PATENT DOCUMENTS

| | | | | |
|---|---|---|---|---|
| 8,982,097 B1* | 3/2015 | Kuzo | | G06F 3/0418 345/174 |
| 2006/0158202 A1* | 7/2006 | Umeda | | G06K 9/0002 324/686 |
| 2006/0284639 A1* | 12/2006 | Reynolds | | G01D 5/24 324/688 |
| 2012/0169662 A1* | 7/2012 | Chan | | G06F 3/0416 345/174 |
| 2013/0207926 A1* | 8/2013 | Kremin | | G06F 3/0383 345/174 |
| 2014/0049507 A1* | 2/2014 | Shepelev | | G06F 3/0412 345/174 |
| 2015/0009175 A1* | 1/2015 | Berget | | G06F 3/044 345/174 |

(Continued)

*Primary Examiner* — Kent W Chang
*Assistant Examiner* — Nathaniel P Brittingham
(74) *Attorney, Agent, or Firm* — Ferguson Braswell Fraser Kubasta PC

(57) ABSTRACT

Transmitter axis projection for capacitive sensing is disclosed. Transmitter axis projection includes having processing system. The processing system includes sensor circuitry configured to be coupled to transmitter electrodes and receiver electrodes. The sensor circuitry is configured to drive the transmitter electrodes with first transmitter signals and receive first resulting signals from the receiver electrodes, and drive only a first subset of the receiver electrodes with second transmitter signals and receive second resulting signals with the transmitter electrodes. The processing system further includes processing circuitry connected to the sensor circuitry and configured to partition the receiver electrodes into the first subset of receiver electrodes and a second subset of receiver electrodes, and generate a transmitter axis projection from the second resulting signals.

17 Claims, 8 Drawing Sheets

(56) References Cited

U.S. PATENT DOCUMENTS

| | | | |
|---|---|---|---|
| 2015/0042600 A1* | 2/2015 | Lukanc | G06F 3/0412 |
| | | | 345/174 |
| 2015/0378495 A1* | 12/2015 | Losh | G06F 3/0416 |
| | | | 345/174 |
| 2017/0160862 A1* | 6/2017 | Suzuki | G06F 3/0412 |
| 2017/0192605 A1* | 7/2017 | Goudarzi | G06F 3/0418 |
| 2018/0032176 A1* | 2/2018 | Krah | G02F 1/13338 |

* cited by examiner

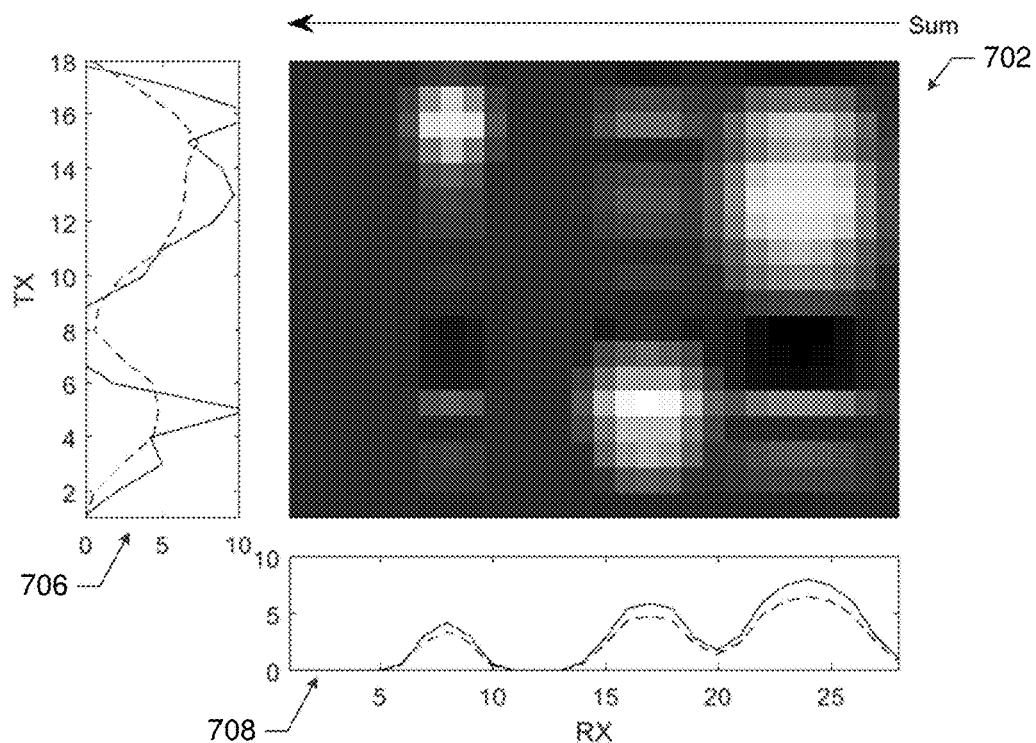
FIG. 7.1
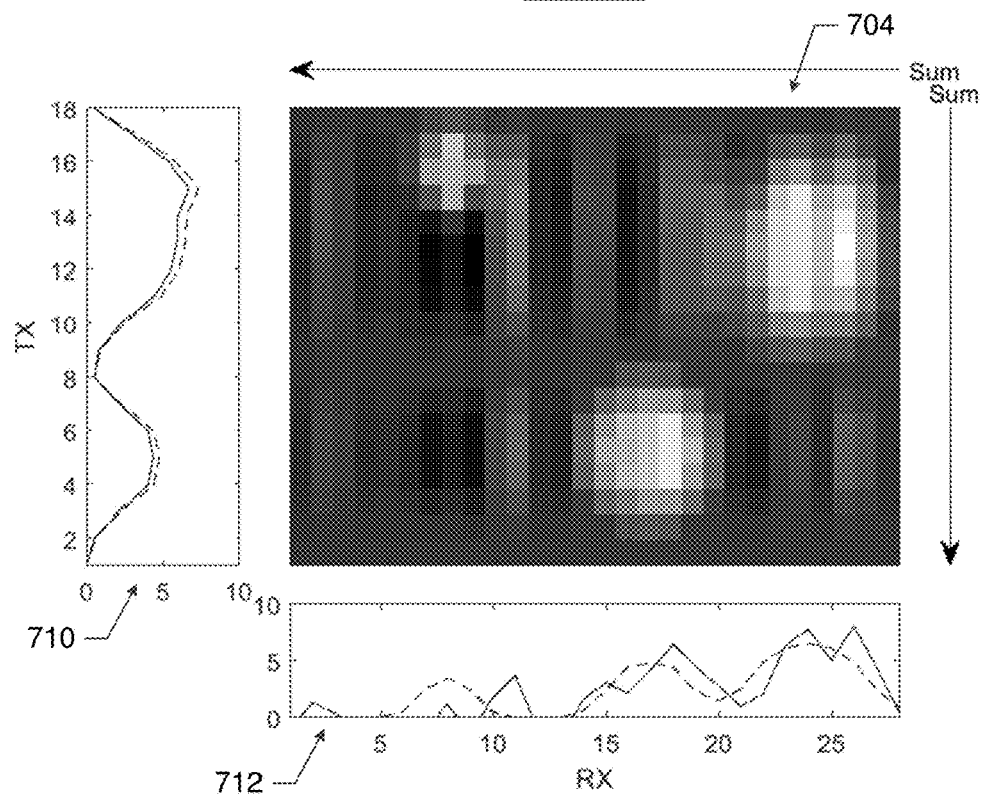
FIG. 7.2

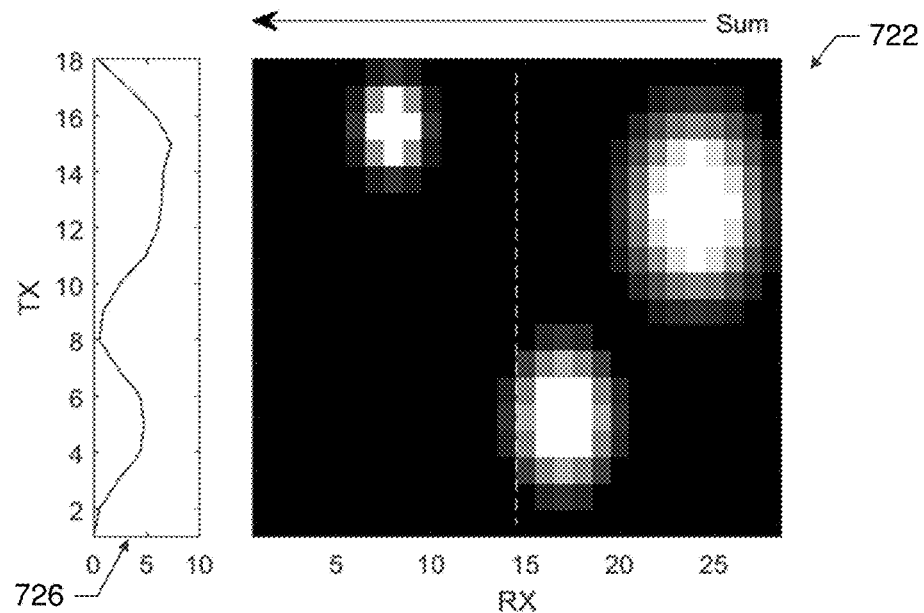
*FIG. 7.3*
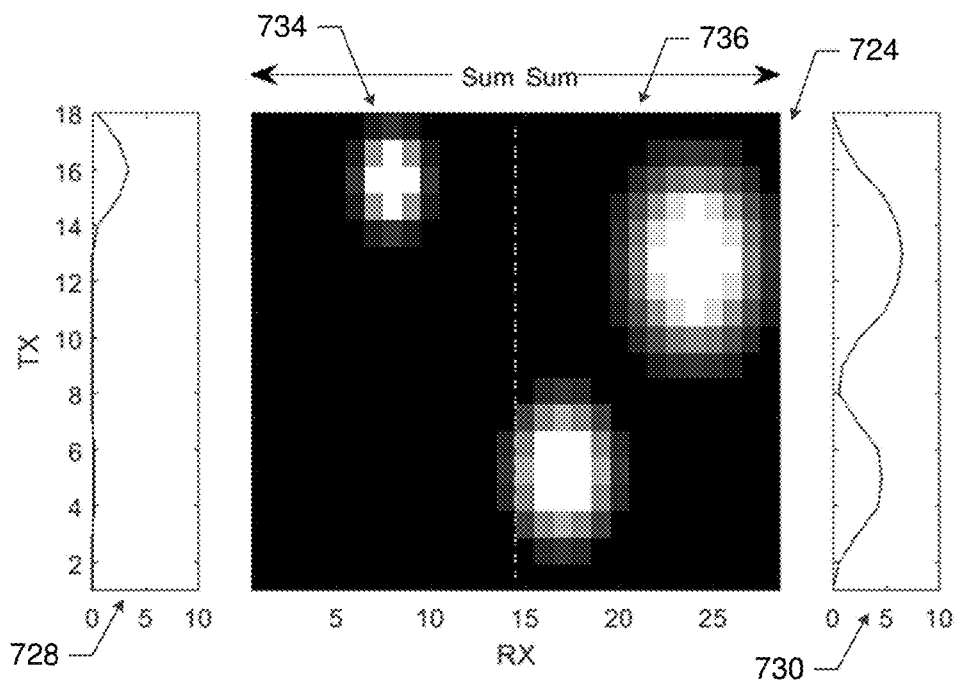
*FIG. 7.4*

TRANSMITTER AXIS PROJECTION CONSTRUCTION FOR CAPACITIVE SENSING

FIELD

This invention generally relates to electronic devices.

BACKGROUND

Input devices, including proximity sensor devices (also commonly called touchpads or touch sensor devices), are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

SUMMARY

Transmitter axis projection for capacitive sensing is disclosed. Transmitter axis projection includes having processing system. The processing system includes sensor circuitry configured to be coupled to transmitter electrodes and receiver electrodes. The sensor circuitry is configured to drive the transmitter electrodes with first transmitter signals and receive first resulting signals from the receiver electrodes, and drive only a first subset of the receiver electrodes with second transmitter signals and receive second resulting signals with the transmitter electrodes. The processing system further includes processing circuitry connected to the sensor circuitry and configured to partition the receiver electrodes into the first subset of receiver electrodes and a second subset of receiver electrodes, and generate a transmitter axis projection from the second resulting signals.

A method is disclosed that includes driving transmitter electrodes with first transmitter signals and receive first resulting signals from receiver electrodes, partitioning the receiver electrodes into a first subset of receiver electrodes and a second subset of receiver electrodes, and driving only the first subset of the receiver electrodes with second transmitter signals and receive second resulting signals with the transmitter electrodes. The method further includes generating a transmitter axis projection from the second resulting signals.

An input device is disclosed. The input device includes transmitter electrodes, receiver electrodes, and processing system comprising circuitry. The processing system is for driving the transmitter electrodes with first transmitter signals and receive first resulting signals from the receiver electrodes, partitioning the receiver electrodes into a first subset of receiver electrodes and a second subset of receiver electrodes, and driving only the first subset of the receiver electrodes with second transmitter signals and receive second resulting signals with the transmitter electrodes. The processing system is further for generating a transmitter axis projection from the second resulting signals.

Other aspects of the invention will be apparent from the following description and the appended claims.

BRIEF DESCRIPTION OF DRAWINGS

The preferred exemplary embodiment of the present invention will hereinafter be described in conjunction with the appended drawings, where like designations denote like elements, and;

FIGS. 7.1, 7.2, 7.3, and 7.4 are examples in accordance with one or more embodiments of the invention.

DETAILED DESCRIPTION

The following detailed description is merely exemplary in nature, and is not intended to limit the invention or the application and uses of the invention. Furthermore, there is no intention to be bound by any expressed or implied theory presented in the preceding technical field, background, brief summary or the following detailed description.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Further, although the description includes a discussion of various embodiments of the invention, the various disclosed embodiments may be combined in virtually any manner. All combinations of the embodiments of the invention are contemplated herein.

Various embodiments of the present invention provide input devices and methods that facilitate improved usability.

Figure 1:
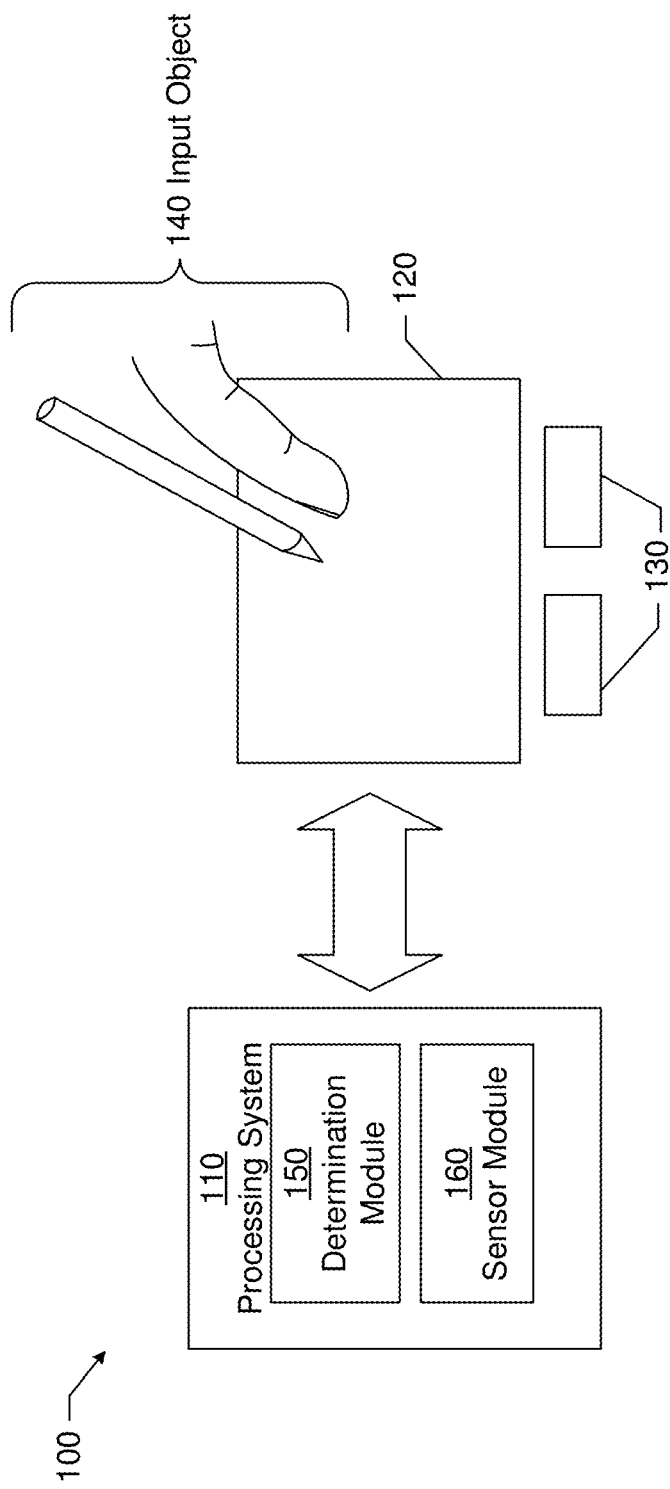
FIG. 1 is a block diagram of an example system that includes an input device in accordance with an embodiment of the invention.

Turning now to the figures, FIG. 1 is a block diagram of an exemplary input device (100), in accordance with embodiments of the invention. The input device (100) may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device (100) and separate joysticks or key switches. Further example electronic systems include peripherals, such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device (100) may be implemented as a physical part of the electronic system, or may be physically separate from the electronic system. Further, portions of the input device (100) may be part of the electronic system. For example, all or part of the determination module may be implemented in the device driver of the electronic system. As appropriate, the input device (100) may communicate with parts of the electronic system using any one or more of the following: buses, networks, and other wired or wireless interconnections. Examples include I2C, SPI, PS/2, Universal Serial Bus (USB), Bluetooth, RF, and IRDA.

In FIG. 1, the input device (100) is shown as a proximity sensor device (also often referred to as a "touchpad" or a "touch sensor device") configured to sense input provided by one or more input objects (140) in a sensing region (120). Example input objects include fingers and styli, as shown in FIG. 1. Throughout the specification, the singular form of input object is used. Although the singular form is used, multiple input objects may exist in the sensing region (120). Further, which particular input objects are in the sensing region may change over the course of one or more gestures. To avoid unnecessarily complicating the description, the singular form of input object is used and refers to all of the above variations.

The sensing region (120) encompasses any space above, around, in and/or near the input device (100) in which the input device (100) is able to detect user input (e.g., user input provided by one or more input objects (140)). The sizes, shapes, and locations of particular sensing regions may vary widely from embodiment to embodiment.

In some embodiments, the sensing region (120) extends from a surface of the input device (100) in one or more directions into space until signal-to-noise ratios prevent sufficiently accurate object detection. The extension above the surface of the input device may be referred to as the above surface sensing region. The distance to which this sensing region (120) extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device (100), contact with an input surface (e.g. a touch surface) of the input device (100), contact with an input surface of the input device (100) coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region (120) has a rectangular shape when projected onto an input surface of the input device (100).

The input device (100) may utilize any combination of sensor components and sensing technologies to detect user input in the sensing region (120). The input device (100) includes one or more sensing elements for detecting user input. As several non-limiting examples, the input device (100) may use capacitive, elastive, resistive, inductive, magnetic, acoustic, ultrasonic, and/or optical techniques.

Some implementations are configured to provide images that span one, two, three, or higher-dimensional spaces. Some implementations are configured to provide projections of input along particular axes or planes. Further, some implementations may be configured to provide a combination of one or more images and one or more projections.

In some resistive implementations of the input device (100), a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device (100), one or more sensing elements pick up loop currents induced by a resonating coil or pair of coils. Some combination of the magnitude, phase, and frequency of the currents may then be used to determine positional information.

In some capacitive implementations of the input device (100), voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g., system ground), and by detecting the capacitive coupling between the sensor electrodes and input objects. The reference voltage may be a substantially constant voltage or a varying voltage and in various embodiments; the reference voltage may be system ground. Measurements acquired using absolute capacitance sensing methods may be referred to as absolute capacitive measurements.

Some capacitive implementations utilize "mutual capacitance" (or "trans capacitance") sensing methods based on changes in the capacitive coupling between sensor electrodes. In various embodiments, an input object near the sensor electrodes alters the electric field between the sensor electrodes, thus changing the measured capacitive coupling. In one implementation, a mutual capacitance sensing method operates by detecting the capacitive coupling between one or more transmitter sensor electrodes (also "transmitter electrodes" or "transmitter") and one or more receiver sensor electrodes (also "receiver electrodes" or "receiver"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. The reference voltage may be a substantially constant voltage and in various embodiments; the reference voltage may be system ground. In some embodiments, transmitter sensor electrodes may both be modulated. The transmitter electrodes are modulated relative to the receiver electrodes to transmit transmitter signals and to facilitate receipt of resulting signals. A resulting signal may include effect(s) corresponding to one or more transmitter signals, and/or to one or more sources of environmental interference (e.g., other electromagnetic signals). The effect(s) may be the transmitter signal, a change in the transmitter signal caused by one or more input objects and/or environmental interference, or other such effects. Sensor electrodes may be dedicated transmitters or receivers, or may be configured to both transmit and receive. Measurements acquired using mutual capacitance sensing methods may be referred to as mutual capacitance measurements.

Further, the sensor electrodes may be of varying shapes and/or sizes. The same shapes and/or sizes of sensor electrodes may or may not be in the same groups. For example, in some embodiments, receiver electrodes may be of the same shapes and/or sizes while, in other embodiments, receiver electrodes may be varying shapes and/or sizes.

In FIG. 1, a processing system (110) is shown as part of the input device (100). The processing system (110) is configured to operate the hardware of the input device (100) to detect input in the sensing region (120). The processing system (110) includes parts of, or all of, one or more integrated circuits (ICs) and/or other circuitry components. For example, a processing system for a mutual capacitance sensor device may include transmitter circuitry configured to transmit signals with transmitter sensor electrodes, and/or receiver circuitry configured to receive signals with receiver sensor electrodes. Further, a processing system for an absolute capacitance sensor device may include driver circuitry configured to drive absolute capacitance signals onto sensor electrodes, and/or receiver circuitry configured to receive signals with those sensor electrodes. In one or more embodiments, a processing system for a combined mutual and absolute capacitance sensor device may include any combination of the above described mutual and absolute capacitance circuitry. In some embodiments, the processing system (110) also includes electronically-readable instructions, such as firmware code, software code, and/or the like. In some embodiments, components composing the processing system (110) are located together, such as near sensing element(s) of the input device (100). In other embodiments, components of processing system (110) are physically separate with one or more components close to the sensing element(s) of the input device (100), and one or more components elsewhere. For example, the input device (100) may be a peripheral coupled to a computing device, and the processing system (110) may include software configured to run on a central processing unit of the computing device and one or more ICs (perhaps with associated firmware) separate from the central processing unit. As another example, the input device (100) may be physically integrated in a mobile device, and the processing system (110) may include circuits and firmware that are part of a main processor of the mobile device. In some embodiments, the processing system (110) is dedicated to implementing the input device (100). In other embodiments, the processing system (110) also performs other functions, such as operating display screens, driving haptic actuators, etc.

The processing system (110) may be implemented as a set of modules that handle different functions of the processing system (110). Each module may include circuitry that is a part of the processing system (110), firmware, software, or a combination thereof. In various embodiments, different combinations of modules may be used. For example, as shown in FIG. 1, the processing system (110) may include a determination module (150) and a sensor module (160). The determination module (150) may include functionality to determine when at least one input object is in a sensing region, determine signal to noise ratio, determine positional information of an input object, identify a gesture, determine an action to perform based on the gesture, a combination of gestures or other information, and/or perform other operations.

The sensor module (160) may include functionality to drive the sensing elements to transmit transmitter signals and receive the resulting signals. For example, the sensor module (160) may include sensory circuitry that is coupled to the sensing elements. The sensor module (160) may include, for example, a transmitter module and a receiver module. The transmitter module may include transmitter circuitry that is coupled to a transmitting portion of the sensing elements. The receiver module may include receiver circuitry coupled to a receiving portion of the sensing elements and may include functionality to receive the resulting signals.

Although FIG. 1 shows only a determination module (150) and a sensor module (160), alternative or additional modules may exist in accordance with one or more embodiments of the invention. Such alternative or additional modules may correspond to distinct modules or sub-modules than one or more of the modules discussed above. Example alternative or additional modules include hardware operation modules for operating hardware such as sensor electrodes and display screens, data processing modules for processing data such as sensor signals and positional information, reporting modules for reporting information, and identification modules configured to identify gestures, such as mode changing gestures, and mode changing modules for changing operation modes. Further, the various modules may be combined in separate integrated circuits. For example, a first module may be comprised at least partially within a first integrated circuit and a separate module may be comprised at least partially within a second integrated circuit. Further, portions of a single module may span multiple integrated circuits. In some embodiments, the processing system as a whole may perform the operations of the various modules.

In some embodiments, the processing system (110) responds to user input (or lack of user input) in the sensing region (120) directly by causing one or more actions. Example actions include changing operation modes, as well as graphical user interface (GUI) actions such as cursor movement, selection, menu navigation, and other functions. In some embodiments, the processing system (110) provides information about the input (or lack of input) to some part of the electronic system (e.g. to a central processing system of the electronic system that is separate from the processing system (110), if such a separate central processing system exists). In some embodiments, some part of the electronic system processes information received from the processing system (110) to act on user input, such as to facilitate a full range of actions, including mode changing actions and GUI actions.

For example, in some embodiments, the processing system (110) operates the sensing element(s) of the input device (100) to produce electrical signals indicative of input (or lack of input) in the sensing region (120). The processing system (110) may perform any appropriate amount of processing on the electrical signals in producing the information provided to the electronic system. For example, the processing system (110) may digitize analog electrical signals obtained from the sensor electrodes. As another example, the processing system (110) may perform filtering or other signal conditioning. As yet another example, the processing system (110) may subtract or otherwise account for a baseline, such that the information reflects a difference between the electrical signals and the baseline. As yet further examples, the processing system (110) may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device (100) is implemented with additional input components that are operated by the processing system (110) or by some other processing system. These additional input components may provide redundant functionality for input in the sensing region (120), or some other functionality. FIG. 1 shows buttons (130) near the sensing region (120) that may be used to facilitate selection of items using the input device (100). Other types of additional input components include sliders, balls, wheels, switches, and the like. Conversely, in some embodiments, the input device (100) may be implemented with no other input components.

In some embodiments, the input device (100) includes a touch screen interface, and the sensing region (120) overlaps at least part of an active area of a display screen. For example, the input device (100) may include substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device (100) and the display screen may share physical elements. For example, some embodiments may utilize some of the same electrical components for displaying and sensing. In various embodiments, one or more display electrodes of a display device may be configured for both display updating and input sensing. As another example, the display screen may be operated in part or in total by the processing system (110).

It should be understood that while many embodiments of the invention are described in the context of a fully-functioning apparatus, the mechanisms of the present invention are capable of being distributed as a program product (e.g., software) in a variety of forms. For example, the mechanisms of the present invention may be implemented and distributed as a software program on information-bearing media that are readable by electronic processors (e.g., non-transitory computer-readable and/or recordable/writable information bearing media that is readable by the processing system (110)). Additionally, the embodiments of the present invention apply equally regardless of the particular type of medium used to carry out the distribution. For example, software instructions in the form of computer readable program code to perform embodiments of the invention may be stored, in whole or in part, temporarily or permanently, on a non-transitory computer-readable storage medium. Examples of non-transitory, electronically-readable media include various discs, physical memory, memory, memory sticks, memory cards, memory modules, and or any other computer readable storage medium. Electronically-readable media may be based on flash, optical, magnetic, holographic, or any other storage technology.

Although not shown in FIG. 1, the processing system, the input device, and/or the host system may include one or more computer processor(s), associated memory (e.g., random access memory (RAM), cache memory, flash memory, etc.), one or more storage device(s) (e.g., a hard disk, an optical drive such as a compact disk (CD) drive or digital versatile disk (DVD) drive, a flash memory stick, etc.), and numerous other elements and functionalities. The computer processor(s) may be an integrated circuit for processing instructions. For example, the computer processor(s) may be one or more cores or micro-cores of a processor. Further, one or more elements of one or more embodiments may be located at a remote location and connected to the other elements over a network. Further, embodiments of the invention may be implemented on a distributed system having several nodes, where each portion of the invention may be located on a different node within the distributed system. In one embodiment of the invention, the node corresponds to a distinct computing device. Alternatively, the node may correspond to a computer processor with associated physical memory. The node may alternatively correspond to a computer processor or micro-core of a computer processor with shared memory and/or resources.

While FIG. 1 shows a configuration of components, other configurations may be used without departing from the scope of the invention. For example, various components may be combined to create a single component. As another example, the functionality performed by a single component may be performed by two or more components.

Figure 2:
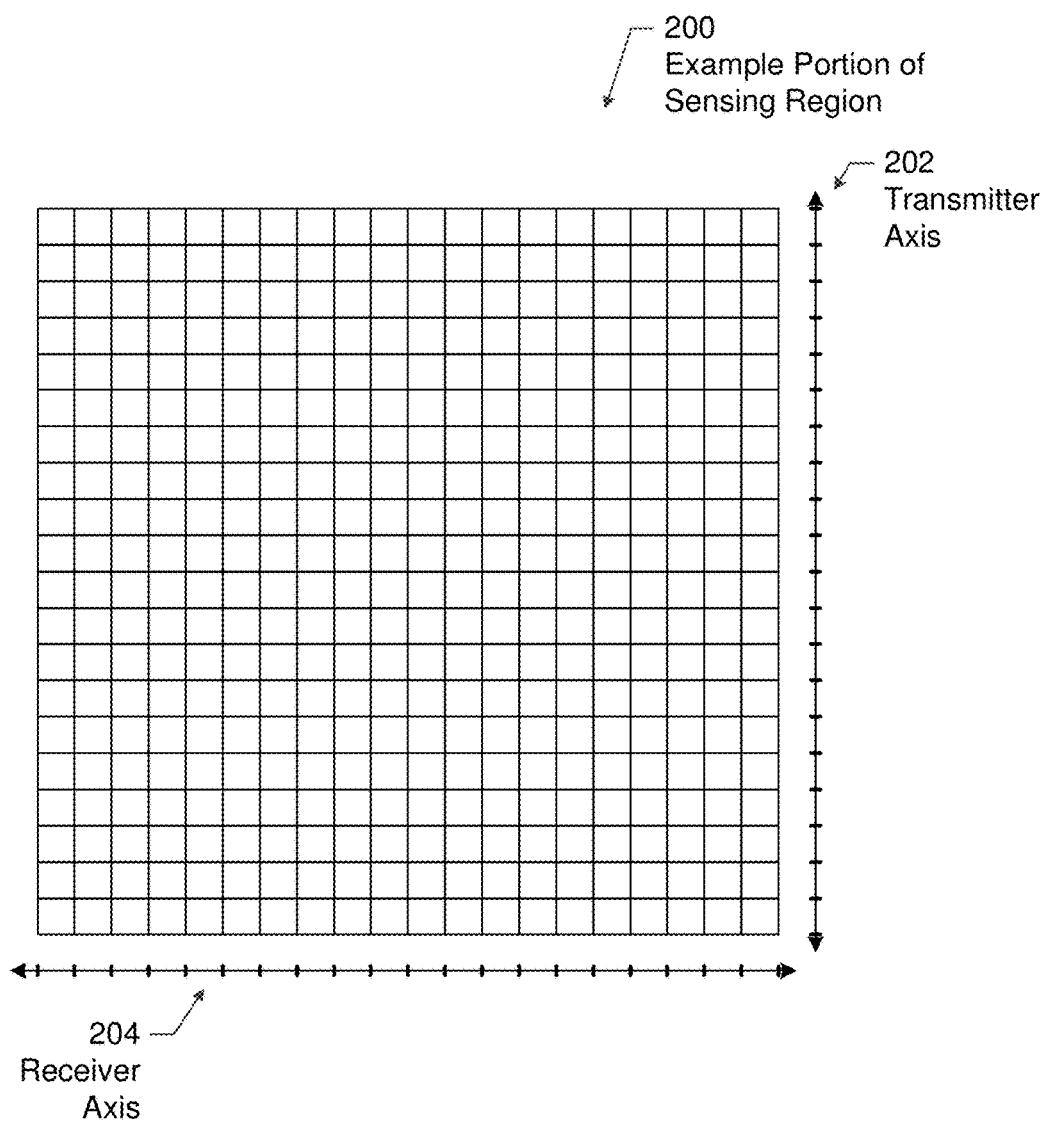
FIGS. 2, 3, and 4 are diagrams of example sensing regions in accordance with one or more embodiments of the invention.

FIG. 2 shows an example diagram of portion of a sensing region (200) in accordance with one or more embodiments of the invention. In one or more embodiments of the invention, the sensing region has a transmitter axis (202) and a receiver axis (204). The transmitter axis (202) has a set of transmitter electrodes that include functionality to transmit transmitter signals. The receiver axis (204) includes a set of receiver electrodes that include functionality to receive resulting signals. The transmitter electrodes and receiver electrodes are sensor electrodes. For transcapacitive sensing, when a transmitter electrode, or sensor electrode on the transmitter axis (202), transmit a transmitter signal, the resulting signals are received by the receiver electrodes, or second set sensor electrodes, on the receiver axis (204). Measurements obtained from the resulting signals may be referred to as capacitive sensor data. The measurements that are used may be raw measurements or pre-processed measurements. In one or more embodiments, the capacitive sensor data obtained by performing the transcapacitive sensing using each transmitter electrode may form a two-dimensional capacitive image. In the two-dimensional capacitive image, each intersection between the transmitter electrode and the receiver electrode has a corresponding value. In other words, the use of the term transcapacitive image refers to a set of measurements whereby each intersection has a measurement value. The capacitive image may or may not be in diagram form, whereby the measurement values are color or grayscale encoded or otherwise displayable. For example, the capacitive image may be a measurement value associated with the corresponding location in the sensing region.

One or more embodiments further include functionality to perform transcapacitive sensing by driving the receiver electrodes on the receiver axis (204) to transmit a transmitter signal and receive the resulting signals by the transmitter electrodes on the transmitter axis (202). In other words, the transcapacitive sensing is performed bi-directionally whereby both the receiver electrodes and the transmitter electrodes are configured to transmit transmitter signals.

When performing transcapacitive sensing, one or more ghost input objects (i.e., ghosts) may be erroneously detected. The ghosts correspond to measurements that appear as if an input object is present when such an input object does not exist on the sensing region. For example, adjacent measurements that satisfy a detection threshold (e.g., are each greater than a detection threshold) may correspond to a ghost. Ghosts can be due to errors in the trans-capacitance data, which can be due to errors in the baseline, interference affecting the transcapacitive measurements. An example of interference is finger-coupled interference. Input object coupled interference occurs when a voltage difference exists between the ground of the phone and the human ground. When a user is touching the sensing region with a finger, the input object coupled interference is finger coupled interference.

Continuing with FIG. 2, one or more embodiments may include functionality to perform hybrid sensing. In other words, the input device shown in FIG. 1 may include functionality to obtain one or more absolute capacitive profiles from the sensing region. An absolute capacitive profile is a single dimensional set of values from the sensing region along a particular axis of the sensing region. For example, a receiver axis absolute capacitance profile is an absolute capacitive profile obtained along the receiver axis (204) of the sensing region (200). The receiver axis absolute capacitance profile is obtained by modulating the receiver electrodes with respect to a reference voltage in order to determine the absolute capacitance of the receiver electrodes. To obtain the receiver axis absolute capacitive profile, the transmitter electrodes are not used. Conversely, a transmitter axis absolute capacitance profile is an absolute capacitive profile obtained along the transmitter axis (202) of the sensing region (200). The transmitter axis absolute capacitance profile is obtained by modulating the transmitter electrodes with respect to a reference voltage in order to determine the absolute capacitance of the transmitter electrodes. To obtain the transmitter axis absolute capacitive profile, the receiver electrodes are not used. Thus, rather than being a two-dimensional capacitive image of the sensing region, the collection of values in the absolute capacitive profiles are single dimensional and include a single raw measured value for each hatch mark shown in FIG. 2 on the transmitter axis (202) and receiver axis (204).

Figure 3:
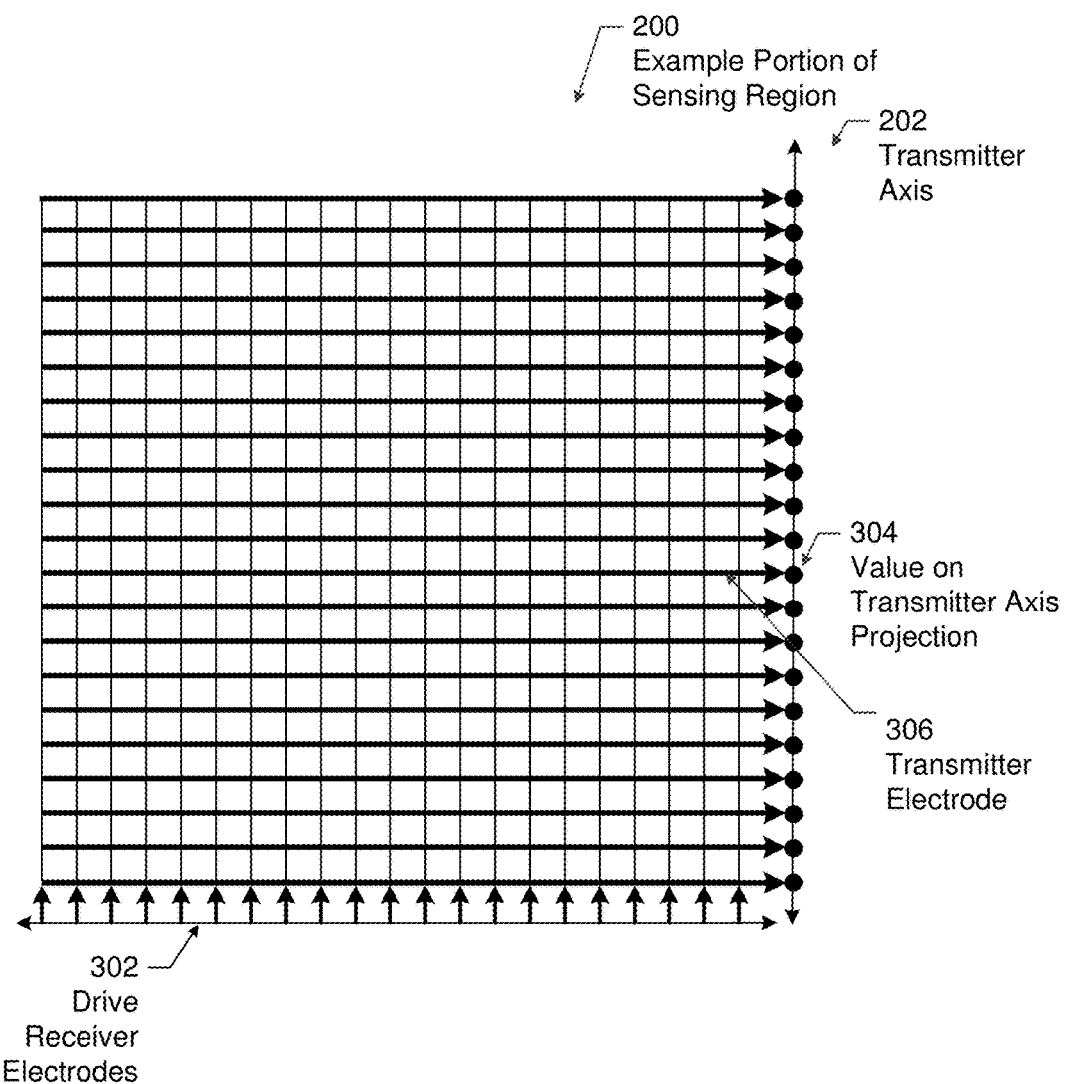

Turning to FIG. 3, FIG. 3 shows an example portion of the sensing region (200). As shown in FIG. 3, one or more embodiments are configured to drive the receiver electrodes (302). The two or more receiver electrodes may be driven concurrently using code division multiplexing or sequentially. Transmitter electrodes on the transmitter axis (202) are configured to receive the resulting signals.

As discussed above, capacitive image may be generated from the driving of the receiver electrodes. The capacitive image may be used to generate a transmitter axis projection on the transmitter axis (202). Like the transmitter axis absolute capacitive profile, the transmitter axis projection is single dimensional and has a single value for each transmitter electrode. In other words, a transmitter axis projection may have a single value for each row that is the sum of the values in the transcapacitive image that are in the row. For example, the value on the transmitter axis projection (304) is a sum of the values in the capacitive image along the corresponding transmitter electrode (306). Although not shown in FIG. 3, a receiver axis projection may have a single value for each column that is the sum of the values in the transcapacitive image that are in the column.

Figure 4:
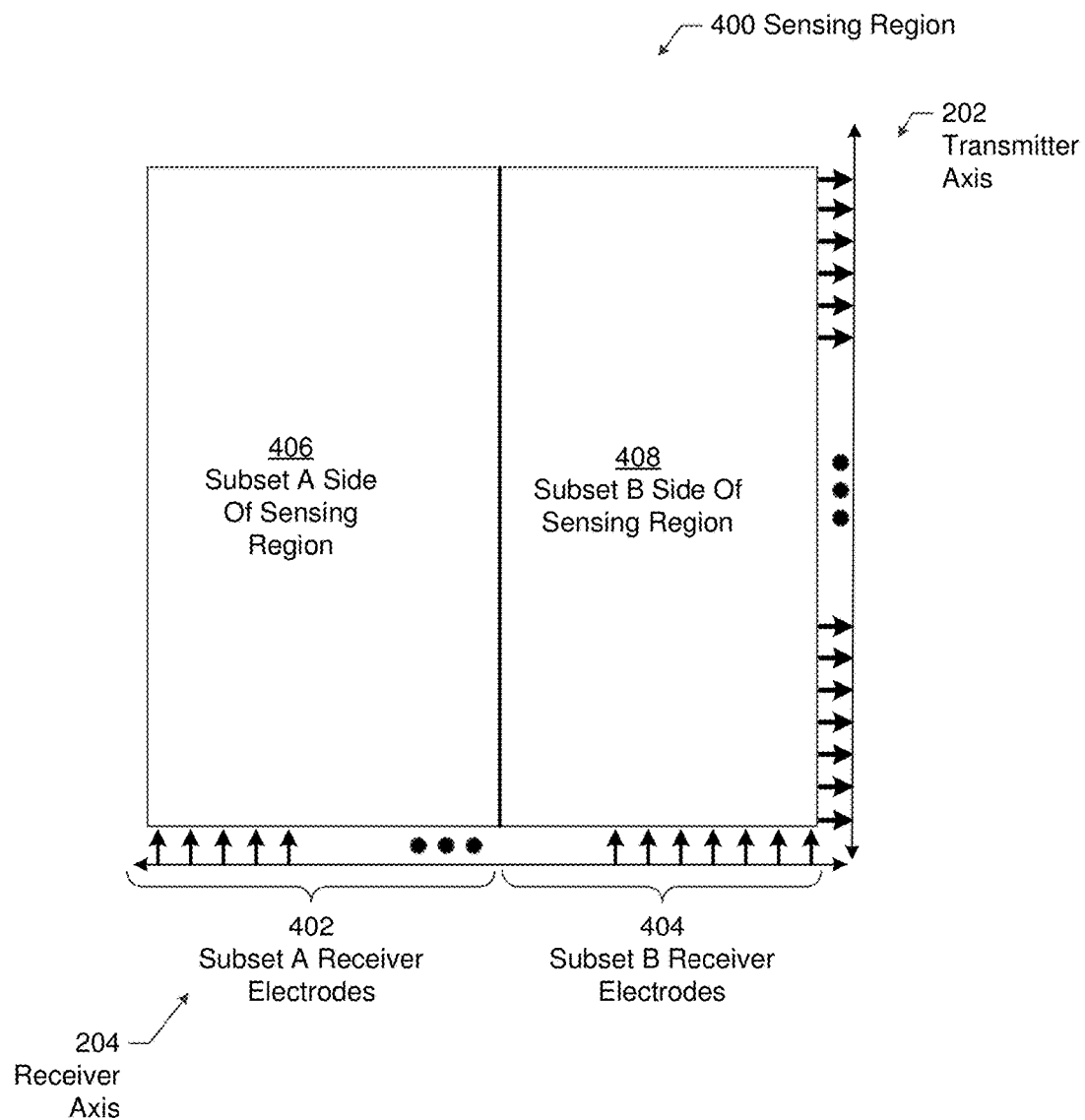

Turning to FIG. 4, FIG. 4 shows a diagram of a sensing region (400) with a transmitter axis (202) and a receiver axis (204). Receiver electrodes on the receiver axis are partitioned into subsets (e.g., subset A receiver electrodes (402), subset B receiver electrodes (404)). The receiver electrodes may be partitioned into equal subsets or unequal subsets. In other words, the number of receiver electrodes in subset A (402) may be the same or different than the number of receiver electrodes in subset B (404). While one subset is driven with transmitter signals having a variable voltage, the other subset may be held at a fixed voltage. The fixed voltage may be the reference voltage of the receiver circuitry on the transmitter axis electrodes. The effect of the driving is that a capacitive image is generated for subset A side of sensing region (406) while subset B side of sensing region (408) is masked.

As discussed above, FIGS. 2-4 are examples. The size, shape, number and configuration of electrodes may vary from the example shown in FIGS. 2-4 without departing from the scope of the invention. In particular, although FIG. 2-4 shows the electrodes as being configured in a grid pattern, the electrodes may be arranged in a different pattern.

Figure 5:
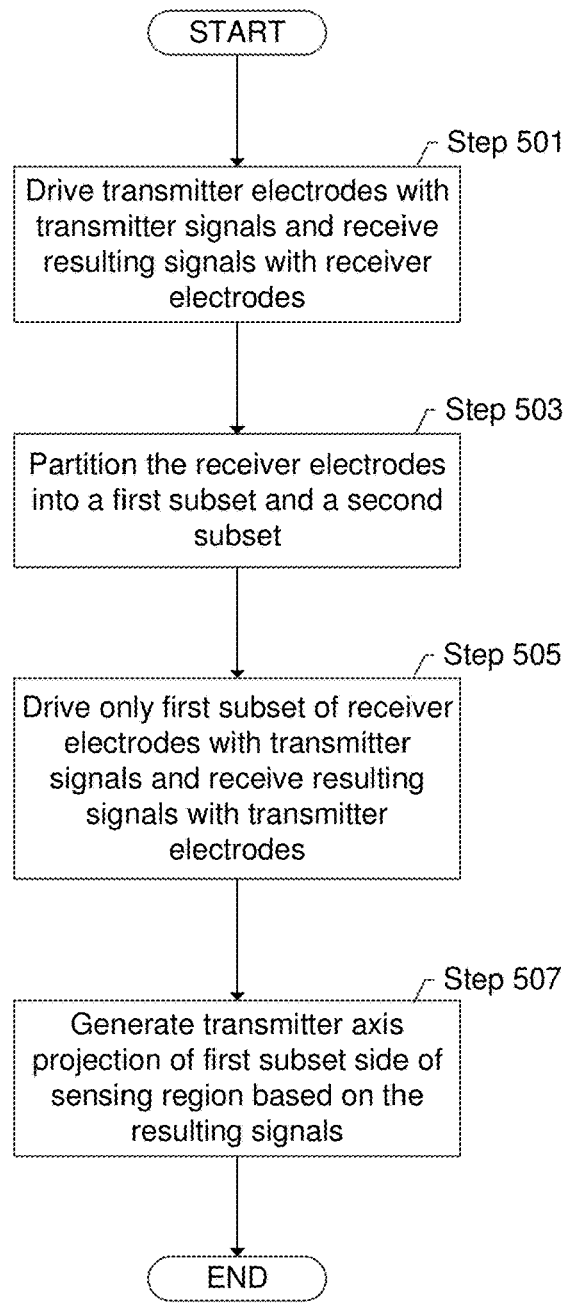
FIGS. 5 and 6 are flowcharts in accordance with one or more embodiments of the invention.
Figure 6:
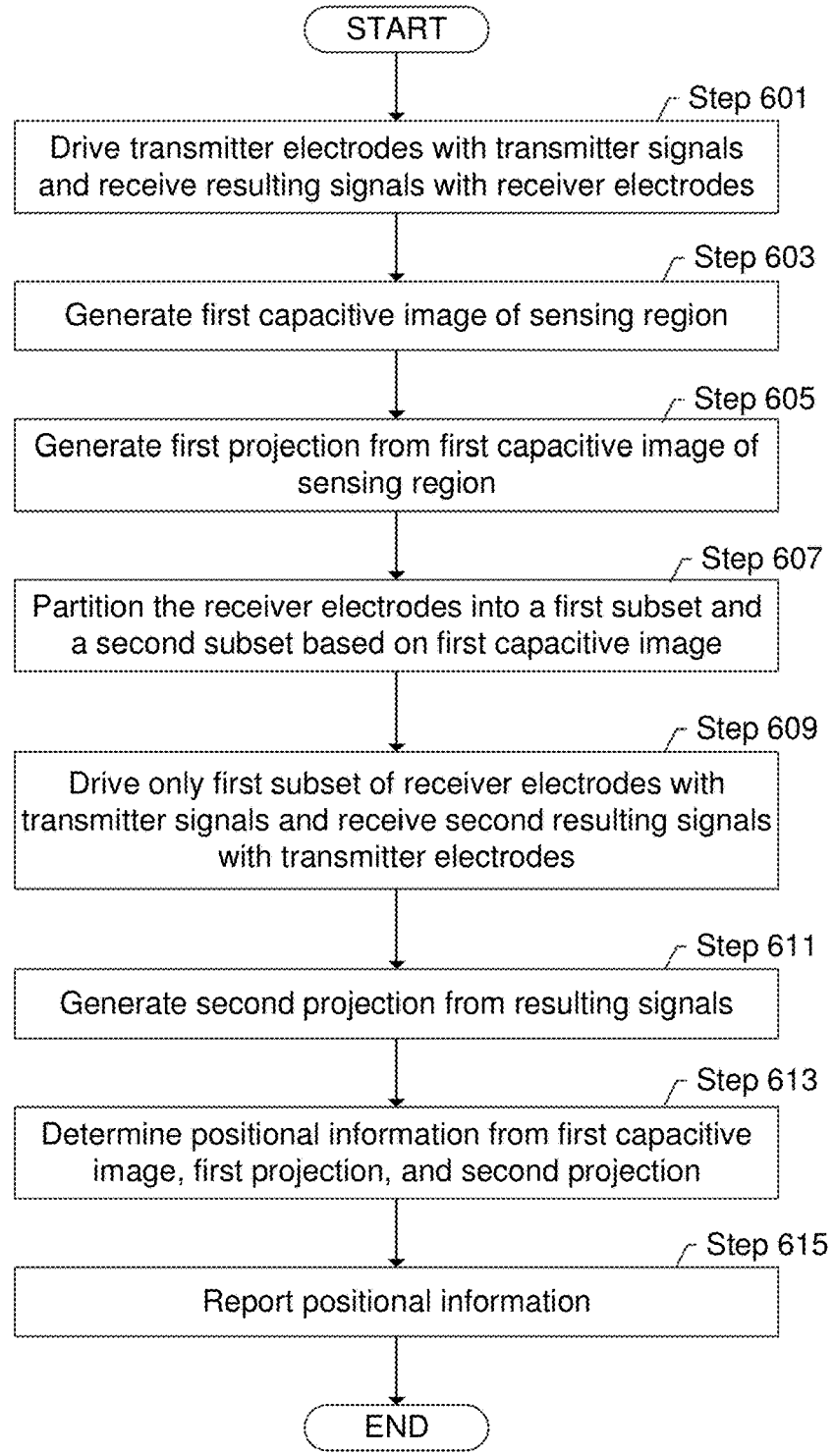

FIGS. 5 and 6 show flowcharts in accordance with one or more embodiments of the invention. In particular, FIG. 5 shows a flowchart for generating a capacitive image of a subset of a sensing region. FIG. 6 shows a flowchart in accordance with at least some embodiments that includes additional details not in FIG. 5. While the various steps in this flowchart are presented and described sequentially, one of ordinary skill will appreciate that some or all of the steps may be executed in different orders, may be combined or omitted, and some or all of the steps may be executed in parallel. Furthermore, the steps may be performed actively or passively. For example, some steps may be performed using polling or be interrupt driven in accordance with one or more embodiments of the invention. By way of an example, determination steps may not require a processor to process an instruction unless an interrupt is received to signify that condition exists in accordance with one or more embodiments of the invention. As another example, determination steps may be performed by performing a test, such as checking a data value to test whether the value is consistent with the tested condition in accordance with one or more embodiments of the invention.

Turning to FIG. 5, in Step 501, the transmitter electrodes are driven with transmitter signals and resulting signals are received with receiver electrodes. Because the transmitter electrodes are capacitively coupled to the receiver electrodes, the transmitter signal electrically affects the receiver electrodes by causing resulting signals to be received by the receiver electrodes. Any input objects and/or background capacitance present in the sensing region may also affect the resulting signals. Thus, the change in capacitance reflects the amount of the resulting signal that is attributable to an input object rather than the original driving of the sensor electrode or the background capacitance. Measurements of the resulting signals are obtained. Preprocessing may be performed on the measurements. For example, the preprocessing may be to apply temporal and/or spatial filters, subtract a baseline, or perform any other operations.

In one or more embodiments, driving of the sensor electrodes is performed concurrently for groups of sensor electrodes. In other words, a group of sensor electrodes is concurrently driven and then the next group of sensor electrodes is driven. Code division multiplexing may be used to drive transmitter electrodes in the group concurrently and to attribute each of the resulting signals received to the corresponding transmitter electrodes. In some embodiments, the transmitter electrodes are driven with a same transmitter signal concurrently without code division multiplexing. Guard circuitry may be used to drive the transmitter electrodes concurrently. Thus, a receiver axis projection may be generated without explicitly summing the values along the corresponding receiver electrodes.

Additionally, although not shown, absolute capacitive sensing may be performed. During the absolute capacitive sensing, the sensor circuitry may modulate the transmitter electrodes with respect to a reference voltage. The receiver electrodes may also be modulated with respect to a reference voltage. Based on the modulating, the sensor circuitry may detect the absolute capacitance of the transmitter electrodes and the receiver electrodes, which may be affected by any input object and/or background capacitance.

In Step 503, the receiver electrodes are partitioned into a first subset and a second subset. Different mechanisms may be used to partition the sensor electrodes into the first subset and the second subset. For example, one method may be to partition the receiver electrodes according to multiplexing subsets. In particular, when the receiver electrodes are receiving the resulting signals, the receiver electrodes may be partitioned into multiplexing subsets, such as for resource conservation or management. In other words, receiver electrodes in the same multiplexing subset may receive resulting signals concurrently, while receiver electrodes in different multiplexing subsets may receive resulting signals at non-overlapping times. Returning to Step 503, when the receiver electrodes are driven and transmitting a signal, partitioning the receiver electrodes into subsets may be to keep the partitioning of the multiplexing subsets as when the receiver electrodes are on the receiving the signal. Thus, receiver electrodes that are in the same multiplexing subset are partitioned into the same subset in Step 503. Receiver electrodes that are not in the same multiplexing subset are not partitioned into the same subset in Step 503. By way of a more concrete example, if a receiver electrode is subject to two to one multiplexing, then the receiver electrodes for one multiplexing subset are selected and driven. Next, the receiver electrodes in the other multiplexing subset are selected and driven.

Another technique for selecting a subset in Step 503 is to choose a subset of the receiver electrodes based on some pre-defined subsets. In such an example technique, receiver electrodes are selected as being in a subset based on arbitrary selection or spatial arrangement. Further, in the example technique, the sizes of the pre-defined subsets are chosen such that the chips transmitter circuitry has enough capacity to drive the receiver electrodes in the subset concurrently.

In Step 505, only the first subset of receiver electrodes is driven and resulting signals are received with the transmitter electrodes. In other words, instead of driving the transmitter electrodes, the receiver electrodes are driven. Further, the resulting signals are received with the transmitter electrodes. Driving the receiver electrodes and receiving resulting signals may be performed in a manner similar to Step 501. In one or more embodiments, the subset of receiver electrodes is driven with same transmitter signals.

In Step 507, a transmitter axis projection of a first subset side of sensing region is generated based on the resulting signals. The transmitter axis projection obtained by driving the receiver electrodes may be different from a transmitter axis projection generated using the capacitive image obtained by driving the transmitter electrodes. In other words, artifacts from input object coupled noise in the sensing region may affect the capacitive image generated by the driving of transmitter electrodes. The same input object coupled noise may not exist when driving the subset of receiver electrodes. Other processing and usage of the projections may be performed.

Although FIG. 5 presents partitioning the receiver electrodes into two subsets, the receiver electrodes may be partitioned into more than two subsets without departing from the scope of the claims. In such a scenario, each of the more than two subsets may be individually driven at non-overlapping times.

FIG. 6 shows a more detailed flowchart in accordance with one or more embodiments of the invention. In particular, at least some of the Steps described in FIG. 6 may be incorporated into the flowchart of FIG. 5.

In Step 601, the transmitter electrodes are driven with transmitter signals and resulting signals are received with receiver electrodes. Step 601 may be performed in a same or similar manner to Step 501 of FIG. 5.

In Step 603, a first capacitive image of the sensing region generated in accordance with one or more embodiments of the invention. The measurements from the resulting signals are combined into a first capacitive image, whereby each measurement is related to the location of the measurement relative to the sensing region.

In Step 605, a first projection is generated from the first capacitive image of the sensing region. The measurements along the same receiver electrode are summed to create a value for the receiver electrode in the first projection. By repeating the process for each electrode, the first projection is generated. By way of another example, the transmitter electrodes may transmit with the same transmitter signal concurrently. The resulting signal received by the receiver electrode may correspond to the value in the projection.

In Step 607, the receiver electrodes are partitioned into a first subset and a second subset based on the first capacitive image. Partitioning the receiver electrodes may be performed using a same or similar technique discussed above with reference to FIG. 5.

In Step 609, only the first subset of receiver electrodes is driven while driving the second subset with an opposite polarity, and second resulting signals are received with the transmitter electrodes in accordance with one or more embodiments of the invention. Driving the subset of receiver electrodes may be performed as discussed above with respect to Step 507 of FIG. 5. Further, the first subset may be driven with the same transmitter signal. For example, the first subset of receiver electrodes may be driven concurrently with guard circuitry. Concurrently while driving the first subset, the second subset is held at a fixed voltage.

In Step 611, a second projection from the second capacitive image is generated in accordance with one or more embodiments of the invention. The resulting signal is received by each transmitter electrode and is measured. The measurement results in a projection along the transmitter axis for only the subset of the sensing region. In other words, only the first subset of receiver electrodes contributes to the second projection.

In Step 613, positional information is determined from the first capacitive image, the first projection, and the second projection. The second projection may be used for moisture management (e.g., detect the presence of moisture), mitigate the effects of moisture, determine whether the input object is in a low ground mass state, determine the correction factor to apply to the mutual capacitive measurements in Step 601 to correct for the low ground mass state of the input object, and perform other actions. Once various deleterious effects on the mutual capacitive and/or absolute capacitive measurements are accounted for using the second projection to obtain a processed capacitive image and/or profile, the processed capacitive image and/or profile may be used to identify the position, size, and shape of input objects in the sensing region. The position, size, and shape may be combined into positional information.

In Step 615, positional information is reported in accordance with one or more embodiments of the invention. For example, the positional information may be reported to a central processing unit, an operating system, a user level application, etc. The positional information may be used to change the state of the electronic system.

The following example is for explanatory purposes only and not intended to limit the scope of the invention. FIGS. 7.1, 7.2, 7.3, and 7.4 are examples in accordance with one or more embodiments of the invention. Each example shows a capacitive image and projections.

FIGS. 7.1 and 7.2 show capacitive images (702, 704) and corresponding projections (706, 708, 710, 712). FIGS. 7.1 and 7.2 demonstrate the effectiveness of how driving the receiver electrodes may be used to obtain projections in the presence of finger-coupled noise.

In particular, FIG. 7.1 shows a transcapacitive image (702) with real touch data plus finger-coupled noise (i.e., due to a charger). The transcapacitive image (702) is projected onto the receiver (RX) axis (i.e., horizontal axis) to obtain projection (708) and transmitter (TX) axis (i.e., vertical axis) to obtain projection (706). The dashed lines in the projections (706, 708) show touch signal only while the solid lines show touch and noise signal. Notably, the signal received using capacitive sensing is a touch and noise signal. Thus, the touch signal shown in the figures is for illustrative purposes. As shown by the degree of similarity between the solid and dashed line in projection (708), on the RX axis, the touch and noise signal projection is proportional to the touch only projection. Thus, the touch and noise signal projection is an accurate estimation of the touch only projection. In contrast, on the TX axis, the touch and noise signal projection deviates from the touch only projection. Thus, the TX projection cannot be used to suppress ghosts from finger-coupled noise.

In contrast to FIG. 7.1, FIG. 7.2 shows driving the receiver electrodes with transmitter signals and receiving resulting signals using the transmitter electrodes. The touch signal is the same as the previous figure, but the finger-coupled noise is now aligned to the opposite axis (i.e., the RX axis). In other words, projection (710) shows a greater degree of similarity between touch signal only and touch and noise signal as compared to projection (712).

Because finger coupled noise is present on the driving electrodes axis, performing transcapacitive sensing by driving the transmitter electrodes to obtain a receiver axis projection and performing transcapacitive sensing by driving the receiver electrodes to obtain a transmitter axis projection may result in obtaining two projections that are most similar to a touch only signal.

FIGS. 7.3 and 7.4 show capacitive images (722, 724) and corresponding projections (726, 728, 730). FIGS. 7.3 and 7.4 demonstrate the value of driving a subset of the electrodes to make a projection of part of the sensor.

FIG. 7.3 shows a transcapacitive image (722) with touch signal only (i.e., no finger-coupled noise). The white dashed line in the image illustrates a division in the image. For example, the division may be due to multiplexing on the RX axis. In FIG. 7.3, the entire transcapacitive image (722) is projected onto the TX axis to obtain projection (726). As shown, although three touch locations are present in the transcapacitive image, only two peaks are present in the projection. Because of the projection, it is not clear as to the amount of signal that in the projection (726) that is attributable to each portion of the image.

FIG. 7.4 shows the same transcapacitive image (724) as in FIG. 7.3 (i.e., transcapacitive image (722)). In FIG. 7.4, each half of the receiver electrodes are driven independently, and the halves (734, 736) are projected separately to create projections (728,730), respectively. As shown, the amount of signal attributable to each portion of the image is clear in the projection.

Thus, the embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

What is claimed is:

1. A processing system comprising:
   sensor circuitry configured to be coupled to a plurality of transmitter electrodes and a plurality of receiver electrodes associated with a sensing region, the sensor circuitry configured to:
      drive the plurality of transmitter electrodes with first transmitter signals and receive first resulting signals from the plurality of receiver electrodes,
      wherein the plurality of transmitter electrodes comprises a first transmitter electrode and a second transmitter electrode, and
      drive only a first subset of the plurality of receiver electrodes with second transmitter signals and receive second resulting signals with the plurality of transmitter electrodes,
      wherein the first subset comprises a first receiver electrode and a second receiver electrode; and
   processing circuitry connected to the sensor circuitry and configured to:
      generate a capacitive image of the sensing region from the first resulting signals,
      partition, using the capacitive image, the plurality of receiver electrodes into the first subset of receiver electrodes and a second subset of receiver electrodes, and
      generate a transmitter axis projection from the second resulting signals by:
         determining a single value for the first transmitter electrode based on transcapacitive values between the first transmitter electrode and both the first receiver electrode and the second receiver electrode; and determining a single value for the second transmitter electrode based on transcapacitive values between the second transmitter electrode and both the first receiver electrode and the second receiver electrode.

2. The processing system of claim 1, wherein each of the first subset of the plurality of receiver electrodes is driven with the same transmitter signal concurrently, and wherein the first receiver electrode is adjacent to the second receiver electrode.

3. The processing system of claim 1, wherein the processing circuitry is further configured to:
determine positional information from the transmitter axis projection, and
report the positional information.

4. The processing system of claim 3, wherein determining positional information comprises using the transmitter axis projection to mitigate for effects of moisture on an input surface of the sensing region.

5. The processing system of claim 3, wherein determining positional information comprises using the transmitter axis projection to mitigate for effects of interference.

6. A method comprising:
driving a plurality of transmitter electrodes with first transmitter signals and receive first resulting signals from a plurality of receiver electrodes,
wherein the plurality of transmitter electrodes comprises a first transmitter electrode and a second transmitter electrode, and
wherein the plurality of transmitter electrodes and the plurality of receiver electrodes are associated with a sensing region;
generate a capacitive image of the sensing region from the first resulting signals;
partitioning, using the capacitive image, the plurality of receiver electrodes into a first subset of receiver electrodes and a second subset of receiver electrodes,
wherein the first subset comprises a first receiver electrode and a second receiver electrode;
driving only the first subset of the plurality of receiver electrodes with second transmitter signals and receive second resulting signals with the plurality of transmitter electrodes; and
generating a transmitter axis projection from the second resulting signals by:
determining a single value for the first transmitter electrode based on transcapacitive values between the first transmitter electrode and both the first receiver electrode and the second receiver electrode; and
determining a single value for the second transmitter electrode based on transcapacitive values between the second transmitter electrode and both the first receiver electrode and the second receiver electrode.

7. The method of claim 6, wherein each of the first subset of the plurality of receiver electrodes is driven with the same transmitter signal concurrently, and wherein the first receiver electrode is adjacent to the second receiver electrode.

8. The method of claim 6, further comprising:
determining positional information from the transmitter axis projection, and
reporting the positional information.

9. The method of claim 8, wherein determining positional information comprises using the transmitter axis projection to mitigate for effects of moisture on an input surface of the sensing region.

10. The method of claim 8, wherein determining positional information comprises using the transmitter axis projection to mitigate for effects of interference.

11. An input device comprising:
a plurality of transmitter electrodes associated with a sensing region and comprising a first transmitter electrode and a second transmitter electrode;
a plurality of receiver electrodes associated with sensing region; and
processing system comprising circuitry for:
driving the plurality of transmitter electrodes with first transmitter signals and receive first resulting signals from the plurality of receiver electrodes;
generating a capacitive image of the sensing region from the first resulting signals;
partitioning, using the capacitive image, the plurality of receiver electrodes into a first subset of receiver electrodes and a second subset of receiver electrodes,
wherein the first subset comprises a first receiver electrode and a second receiver electrode;
driving only the first subset of the plurality of receiver electrodes with second transmitter signals and receive second resulting signals with the plurality of transmitter electrodes; and
generating a transmitter axis projection from the second resulting signals by:
determining a single value for the first transmitter electrode based on transcapacitive values between the first transmitter electrode and both the first receiver electrode and the second receiver electrode; and
determining a single value for the second transmitter electrode based on transcapacitive values between the second transmitter electrode and both the first receiver electrode and the second receiver electrode.

12. The input device of claim 11, wherein each of the first subset of the plurality of receiver electrodes is driven with the same transmitter signal concurrently, and wherein the first receiver electrode is adjacent to the second receiver electrode.

13. The input device of claim 11, the circuitry further for:
determining positional information from the transmitter axis projection, and
reporting the positional information.

14. The input device of claim 13, wherein determining positional information comprises using the transmitter axis projection to mitigate for effects of moisture on an input surface of the sensing region.

15. The processing system of claim 1, wherein:
determining the single value for the first transmitter electrode comprises:
obtaining a first transcapacitive value between the first receiver electrode and the first transmitter electrode,
obtaining a second transcapacitive value between the second receiver electrode and the first transmitter electrode, and
calculating a first sum based on the first transcapacitive value and the second transcapacitive value, and
determining the single value for the second transmitter electrode comprises:

obtaining a third transcapacitive value between the first receiver electrode and the second transmitter electrode, obtaining a fourth transcapacitive value between the second receiver electrode and the second transmitter electrode, and calculating a second sum based on the third transcapacitive value and the fourth transcapacitive value.

16. The processing system of claim 1, wherein driving only the first subset comprises driving the first receiver electrode and the second receiver electrode concurrently using code division multiplexing.

17. The method of claim 6, wherein:

determining the single value for the first transmitter electrode comprises:

obtaining a first transcapacitive value between the first receiver electrode and the first transmitter electrode, obtaining a second transcapacitive value between the second receiver electrode and the first transmitter electrode, and calculating a first sum based on the first transcapacitive value and the second transcapacitive value, and determining the single value for the second transmitter electrode comprises:

obtaining a third transcapacitive value between the first receiver electrode and the second transmitter electrode, obtaining a fourth transcapacitive value between the second receiver electrode and the second transmitter electrode, and calculating a second sum based on the third transcapacitive value and the fourth transcapacitive value.

* * * * *